US008633395B2

(12) United States Patent
Ohmi et al.

(10) Patent No.: US 8,633,395 B2
(45) Date of Patent: Jan. 21, 2014

(54) MULTILAYER WIRING BOARD

(75) Inventors: Tadahiro Ohmi, Sendai (JP); Shigetoshi Sugawa, Sendai (JP); Hiroshi Imai, Sendai (JP); Akinobu Teramoto, Sendai (JP)

(73) Assignees: National University Corporation Tohoku University, Miyagi (JP); Foundation For Advancement of International Science, Ibaraki (JP)

( * ) Notice: Subject to any disclaimer, the term of this patent is extended or adjusted under 35 U.S.C. 154(b) by 473 days.

(21) Appl. No.: 12/995,514

(22) PCT Filed: May 22, 2009

(86) PCT No.: PCT/JP2009/059422
§ 371 (c)(1),
(2), (4) Date: Dec. 1, 2010

(87) PCT Pub. No.: WO2009/147956
PCT Pub. Date: Dec. 10, 2009

(65) Prior Publication Data
US 2011/0110052 A1  May 12, 2011

(30) Foreign Application Priority Data
Jun. 6, 2008  (JP) ................................ 2008-149911

(51) Int. Cl.
H05K 1/03  (2006.01)
H05K 1/11  (2006.01)

(52) U.S. Cl.
USPC ........................... 174/255; 361/777; 361/792

(58) Field of Classification Search
USPC ........... 361/777–779, 792–795; 174/255, 261
See application file for complete search history.

(56) References Cited

U.S. PATENT DOCUMENTS

| 6,433,408 | B1 * | 8/2002 | Anjo et al. ................... 257/664 |
| 2002/0060366 | A1 | 5/2002 | Kikuchi et al. | |

FOREIGN PATENT DOCUMENTS

| JP | 11-003904 | 1/1999 |
| JP | 2003-133471 | 5/2003 |
| JP | 2006-74014 | 3/2006 |
| JP | 2006-351647 | 12/2006 |
| JP | 2007-288180 | 11/2007 |
| JP | 2008-109331 | 5/2008 |

OTHER PUBLICATIONS

Office Action mailed Nov. 14, 2012 with English Translation in the corresponding Chinese Application No. 200980121220.7.
Extended European Search Report dated May 31, 2012 for corresponding patent application 09758223.3.

* cited by examiner

*Primary Examiner* — Jeremy Norris
(74) *Attorney, Agent, or Firm* — Morgan, Lewis & Bockius LLP

(57) ABSTRACT

A multilayer wiring board 100 comprises a first wiring region 101 where wirings 103*a* and insulating layers 104*a* and 104*b* are alternately laminated, and a second wiring region 102 where a thickness H2 of an insulating layer 104 is twice or more a thickness H1 of the insulating layer in the first wiring region 101 and a width W2 of a wiring 103*b* is twice or more a width W1 of the wiring in the first wiring region 101. The first wiring region 101 and the second wiring region 102 are integrally formed on the same board.

14 Claims, 15 Drawing Sheets

1) Preparing Core Substrate (Cu Clad Glass Epoxy)

2 or 3 times Repeat:
2) Laminating Cyclo-Olefin Film
3) Adhesion Promoter Penetrating
4) Thermal Process for Curing the Cyclo-Olefin Film
5) Opening Via Hole
6) Treating Smear and Removing the Low-Molecular-Weight Layer with $MnO_4^-$
7) Neutralization
8) Catalyst Addition
9) Catalyst Activation
10) Plating Electro-less Cu
11) Lithography
12) Plating Electricity Cu
13) Removing Resist
14) Thin Cu (Electro-less Cu) Etching

FIG. 11

|  | $Z_0 = 50\Omega$ | $Z_0 = 100\Omega$ |
|---|---|---|
| $H_2 = 80\mu m$ | $W_2 / T (\mu m) = 205 / 15$ | 48.0 / 15 |
| $H_2' = 120\mu m$ | 315 / 15 | 77.0 / 15 |
| $H = 40\mu m$ | 101.2 / 10 | 22.4 / 10 |

FIG. 12

|  |  | $f_p$ (GHz) | $P_{board}$ (mW) |
|---|---|---|---|
|  | $H_2 = 80\mu m \cdot Z_0 = 100\Omega$ | 13.0 | 13.3 |
| Poly Cyclo-Olefin | $H_2' = 120\mu m \cdot Z_0 = 100\Omega$ | 16.1 | 12.6 |
|  | $H = 40\mu m \cdot Z_0 = 50\Omega$ | 8.38 | 29.7 |
| Conventional Epoxy | $H = 40\mu m \cdot Z_0 = 50\Omega$ | 2.45 | 51.3 |

FIG. 18

MULTILAYER WIRING BOARD

This is a U.S. National Phase Entry of PCT Application No. PCT/JP2009/059422, filed May 22, 2009, with a priority date of Jun. 6, 2008, based upon Japanese Patent Application No. 2008-149911.

TECHNICAL FIELD

This invention relates to a multilayer wiring board including a board for mounting thereon semiconductor elements such as LSIs or ICs and, in particular, relates to a semiconductor element mounting board and a multilayer wiring board in general that can reduce electrical signal loss in high-frequency application.

BACKGROUND ART

A multilayer wiring board is widely used such that it is mounted with semiconductor elements and is, along with the semiconductor elements, accommodated in the same package to form a semiconductor device or such that it is mounted with a plurality of electronic components (semiconductor devices and other active components, passive components such as capacitors and resistance elements, etc.) to form an electronic device such as an information device, a communication device, or a display device (see, e.g. Patent Document 1). With higher transmission speed and miniaturization of these semiconductor, information, and other devices in recent years, an increase in signal frequency and signal line density has been advanced so that it is required to simultaneously achieve transmission of a high-frequency signal and high-density wiring.

However, since the propagation loss increases due to the increase in signal frequency and signal line density, it is difficult to ensure the reliability of a transmission signal and thus the problem of achieving the increase in signal line density and the transmission of a high-frequency signal on the same board has not been solved.

PRIOR ART DOCUMENT

Patent Document
    Patent Document 1: JP-A-2007-288180

SUMMARY OF THE INVENTION

Problem to be Solved by the Invention

This invention has been made in view of the above-mentioned problem and has an object to provide a multilayer wiring board that achieves a reduction in propagation loss of a high-frequency signal transmission section and an increase in density of a low-frequency signal transmission section in the same board.

Means for Solving the Problem

According to this invention, a multilayer wiring board is provided. The multilayer wiring board is characterized by comprising a first wiring region where a plurality of first wiring layers are laminated through a first insulating layer, and a second wiring region including a second insulating layer with a thickness which is twice or more a thickness of the first insulating layer and including a second wiring layer provided on the second insulating layer. The second wiring layer has a width which is twice or more a width of the first wiring layer. The first wiring region and the second wiring region are integrally formed on the same board.

With this structure, by transmitting mainly a signal having a frequency of 1 GHz or less in the first wiring region and transmitting mainly a high-frequency signal exceeding 1 GHz at a high speed for a long length of preferably 1 cm or more in the second wiring region, it is possible, while maintaining high mounting density by the first wiring region, to suppress transmission signal degradation by the second wiring region when a high-frequency signal is transmitted for a long length. That is, the first wiring region is used mainly as a low-frequency signal transmission section while the second wiring region is used mainly as a high-frequency signal transmission section.

In this invention, an "insulator" or an "insulating layer" represents one with a resistivity of 1 kΩ-cm or more as measured according to JISC3005. Further, in this invention, a "wiring pattern" or a "wiring" represents a line formed of a material with a resistivity of less than 1 kΩ-cm as measured according to JISC3005 and is used as a concept including a circuit. The cross-sectional shape of the conductor is not limited to a rectangle and may be a circle, an ellipse, or another shape. The cross-sectional shape of the insulator is also not particularly limited.

In this invention, it is preferable that the second wiring region further includes a portion comprising a third insulating layer with a thickness greater than the thickness of the second insulating layer and comprising a third wiring layer provided on the third insulating layer, the third wiring layer having a width greater than the width of the second wiring layer.

In this invention, by setting the thickness of a dielectric forming the insulating layer in the second wiring region and the line width to preferably 40 μm or more and 30 μm or more, respectively, it is possible to more effectively suppress signal degradation when mainly a high-frequency signal exceeding 1 GHz is transmitted for a long length of 1 cm or more.

In this invention, it is preferable that a conductor be formed to penetrate the insulating layer at a boundary portion between the first wiring region and the second wiring region and be grounded. By this, it is possible to suppress electrical coupling of signals in the first wiring region and the second wiring region to each other and thus to suppress radiation noise from the mutual signal lines.

The characteristic impedance of a signal line generally used at present is 50Ω. By designing the line width, the dielectric (insulating layer) thickness, and the line thickness in the first and second wiring regions so that the characteristic impedance becomes preferably 100Ω or more, it is possible to suppress a current that flows in the line and thus to reduce the propagation loss.

Using an insulating material with a permittivity of 2.7 or less and a dissipation factor of 0.015 or less as the insulating layers in the first wiring region and the second wiring region, it is possible to suppress transmission signal degradation.

Effect of the Invention

According to this invention, while maintaining high mounting density by a first wiring region, it is possible to suppress transmission signal degradation by a second wiring region when a high-frequency signal is transmitted for a long length. Therefore, it is possible to achieve an increase in signal line density and an increase in transmission signal frequency on the same multilayer wiring board.

BRIEF DESCRIPTION OF THE DRAWINGS

FIG. 11 is a diagram for explaining the manufacturing flow of the multilayer wiring board shown in FIG. 10.

FIG. 12 is a diagram showing an example of wiring dimensions of microstrip lines used in Example 2.

FIG. 18 is a diagram showing the propagation characteristics of the microstrip lines manufactured in Example 2 in terms of the frequency fp that enables propagation with a loss suppressed to −3 dB for a length of 10 cm, and the consumption power $P_{board}$ per wiring while comparing with a conventional example.

EMBODIMENT FOR CARRYING OUT THE INVENTION (First Embodiment)

Hereinbelow, a first embodiment of this invention will be described with reference to the drawings.

Figure 1:
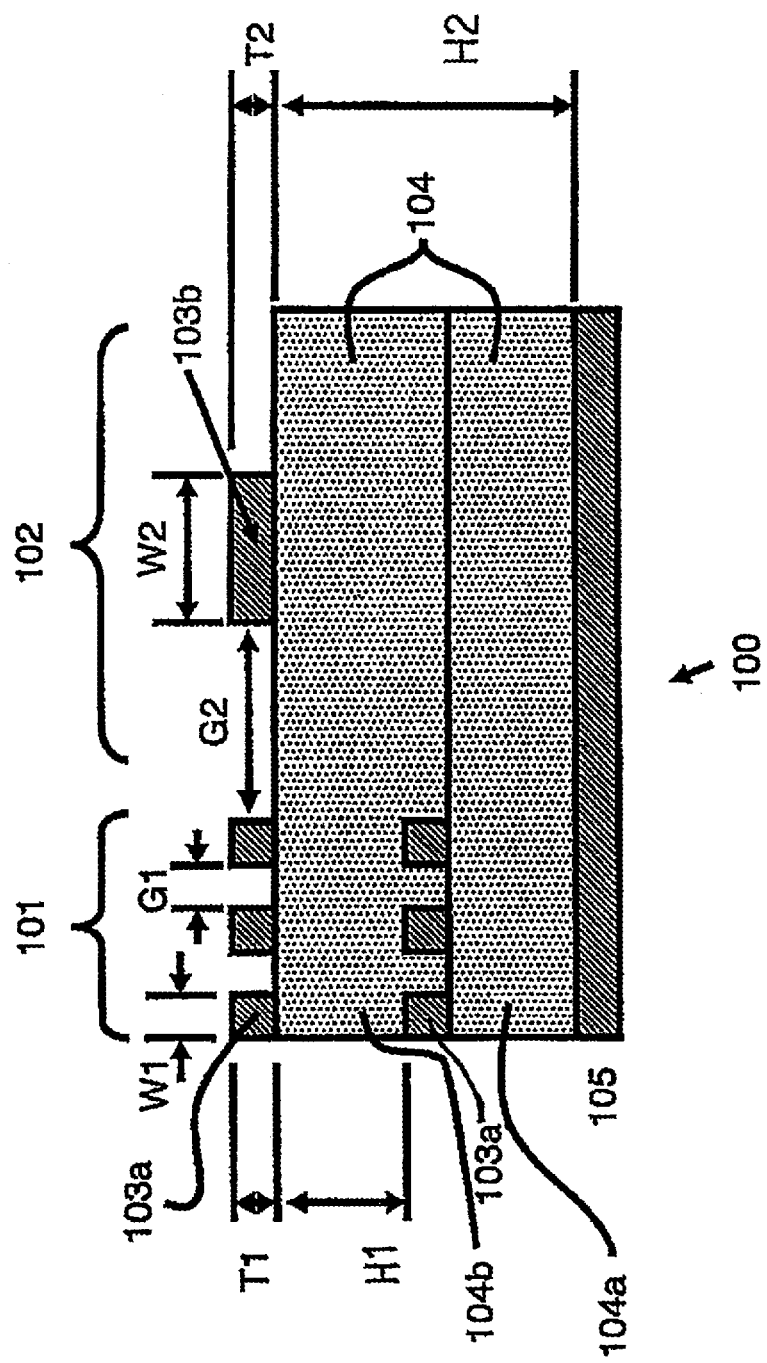
FIG. 1 is a cross-sectional view showing the structure of a multilayer wiring board according to a first embodiment of this invention.

As shown in FIG. 1, a multilayer wiring board 100 as a circuit board according to the first embodiment of this invention has a first wiring region (multilayer wiring region) 101 and a second wiring region (multilayer wiring region) 102. The first wiring region (multilayer wiring region) 101 is formed such that plate-like or film-like insulating layers 104a and 104b and wirings 103a are alternately laminated. The second wiring region (multilayer wiring region) 102 is formed such that a wiring 103b is provided on an insulating layer 104 having an insulating layer thickness H2 which is twice or more an insulating layer thickness H1 per layer in the first wiring region 101. The wiring 103b has a line width W2 which is twice or more a line width W1 of the wiring 103a in the first wiring region 101.

The multilayer wiring board 100 of the first embodiment is used, for example, as a semiconductor element package board. In the multilayer wiring board 100, the second wiring region 102 is used mainly in an application where the frequency of a signal transmitted from a terminal of a semiconductor element exceeds 1 GHz and the propagation length thereof exceeds 1 cm, while the first wiring region 101 is used in other than that application.

The insulating layer thickness H2 in the second wiring region 102 is not particularly limited, but, by setting it to preferably 40 μm or more, it is possible to largely reduce the propagation loss of a high-frequency signal of 1 GHz or more. The line width W2 of the wiring 103b is not particularly limited, but, by setting it to preferably 30 μm or more, it is possible to largely reduce the propagation loss of a high-frequency signal of 1 GHz or more.

The characteristic impedance of the first wiring region 101 is not particularly limited. On the other hand, by designing the line width, the dielectric (insulating layer) thickness, and the line thickness in the second wiring region 102 so that the characteristic impedance thereof becomes preferably 100Ω or more, it is possible to suppress a current that flows in the wiring and thus to reduce the propagation loss particularly at high frequencies.

A distance G1 between the wirings in the first wiring region 101 is not particularly limited. A distance G2 between the wirings in the boundary between the first wiring region 101 and the second wiring region 102 is not particularly limited, but, by setting it equal to or greater than the insulating layer thickness H2 in the second wiring region 102, it is possible to suppress coupling between the wirings and thus to suppress crosstalk noise. A thickness T1 of the wiring layer in the first wiring region 101 is not particularly limited. A thickness T2 of the wiring layer in the second wiring region 102 is not particularly limited, but, is preferably equal to or greater than a penetration depth d of an electromagnetic wave into the wiring, which value d is given by the following formula 1, assuming that the transmission signal frequency is given by f, the conductivity of the insulating wiring 103b by σ, and its magnetic permeability by μ.

$$d = \frac{1}{\sqrt{\pi f \mu \sigma}} \quad \text{[Formula 1]}$$

A method of integrally forming the first wiring region 101 and the second wiring region 102 in the same board is carried out, for example, in the following manner.

Figure 2:
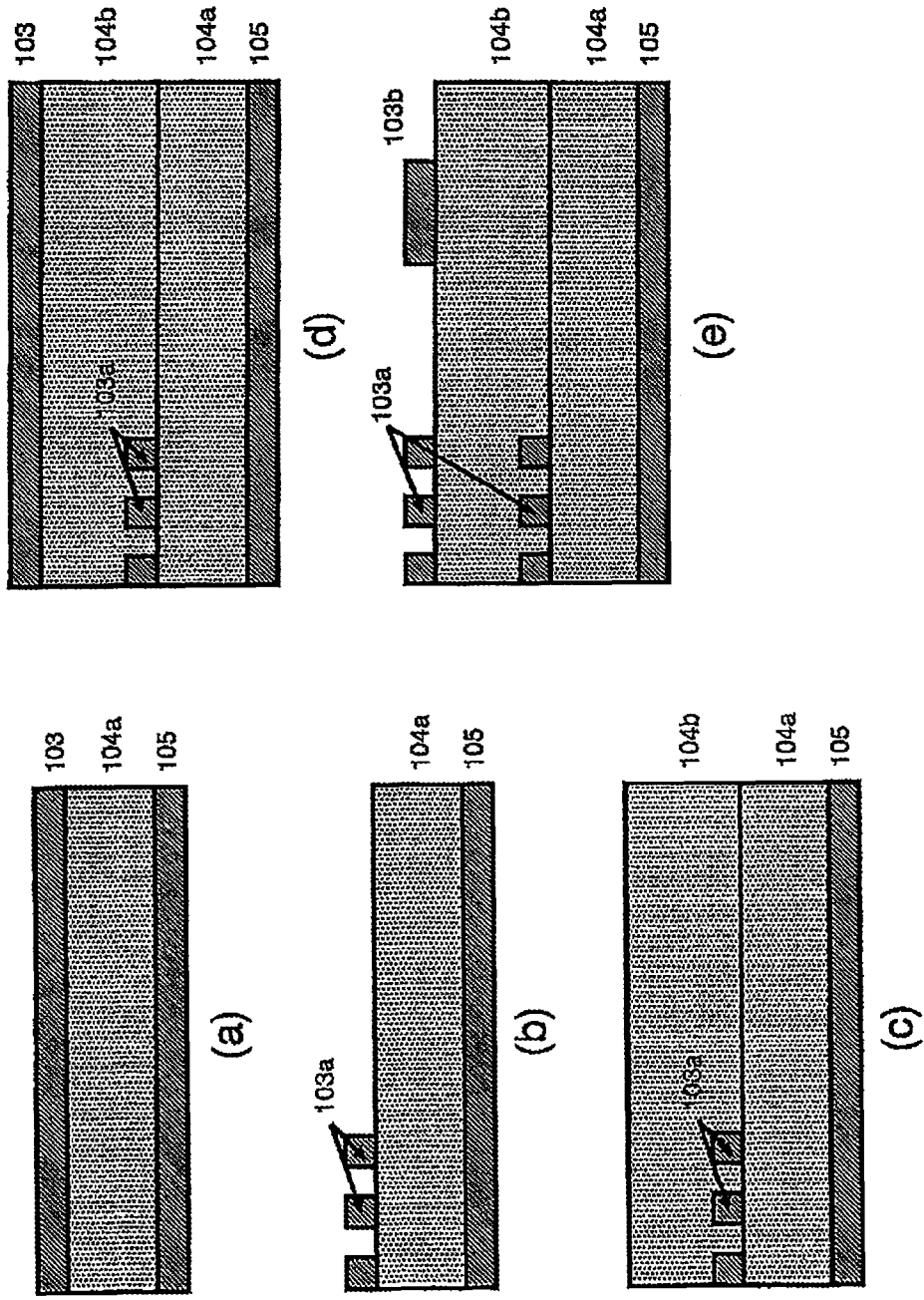
FIG. 2 is a cross-sectional view showing the manufacturing flow of the multilayer wiring board shown in FIG. 1.

As shown at (a) in FIG. 2, first, a lower insulating layer 104a of an insulating layer 104 (FIG. 1) is formed into a sheet. A conductive film 105 is formed on a lower surface of the lower insulating layer 104a and a wiring layer 103 is formed on an upper surface of the lower insulating layer 104a. The conductive film 105 and the wiring layer 103 can each be, for example, a Cu film formed by a plating method, a sputtering method, or an organic metal CVD method, a film of metal such as Cu formed by a bonding method, or the like.

Then, as shown at (b) in FIG. 2, the wiring layer 103 is patterned by a photolithography method or the like, thereby forming wirings 103a having a predetermined pattern. The wirings 103a form a wiring pattern in the first wiring region 101 while the wiring layer in the second wiring region 102 is removed by an etching method or the like. Subsequently, as shown at (c) in FIG. 2, an upper insulating layer 104b is formed on the lower insulating layer 104a formed with the wirings 103a. The upper insulating layer 104b is formed into a sheet, for example, in the same manner as the lower insulating layer 104a and is bonded to the lower insulating layer 104a, for example, by a pressing method.

Thereafter, as shown at (d) in FIG. 2, a wiring layer 103 is formed on the upper insulating layer 104b. Subsequently, as shown at (e) in FIG. 2, the wiring layer 103 on the upper insulating layer 104b is patterned by a photolithography method or the like, thereby forming wirings 103a on the upper insulating layer 104b in the first wiring region 101 and forming a wiring 103b on the upper insulating layer 104b in the second wiring region 102.

The upper insulating layer 104b may alternatively be formed, for example, by a spin-coating method, a coating method, or the like.

(Second Embodiment)

Next, a second embodiment will be described with reference to FIG. 3.

Figure 3:
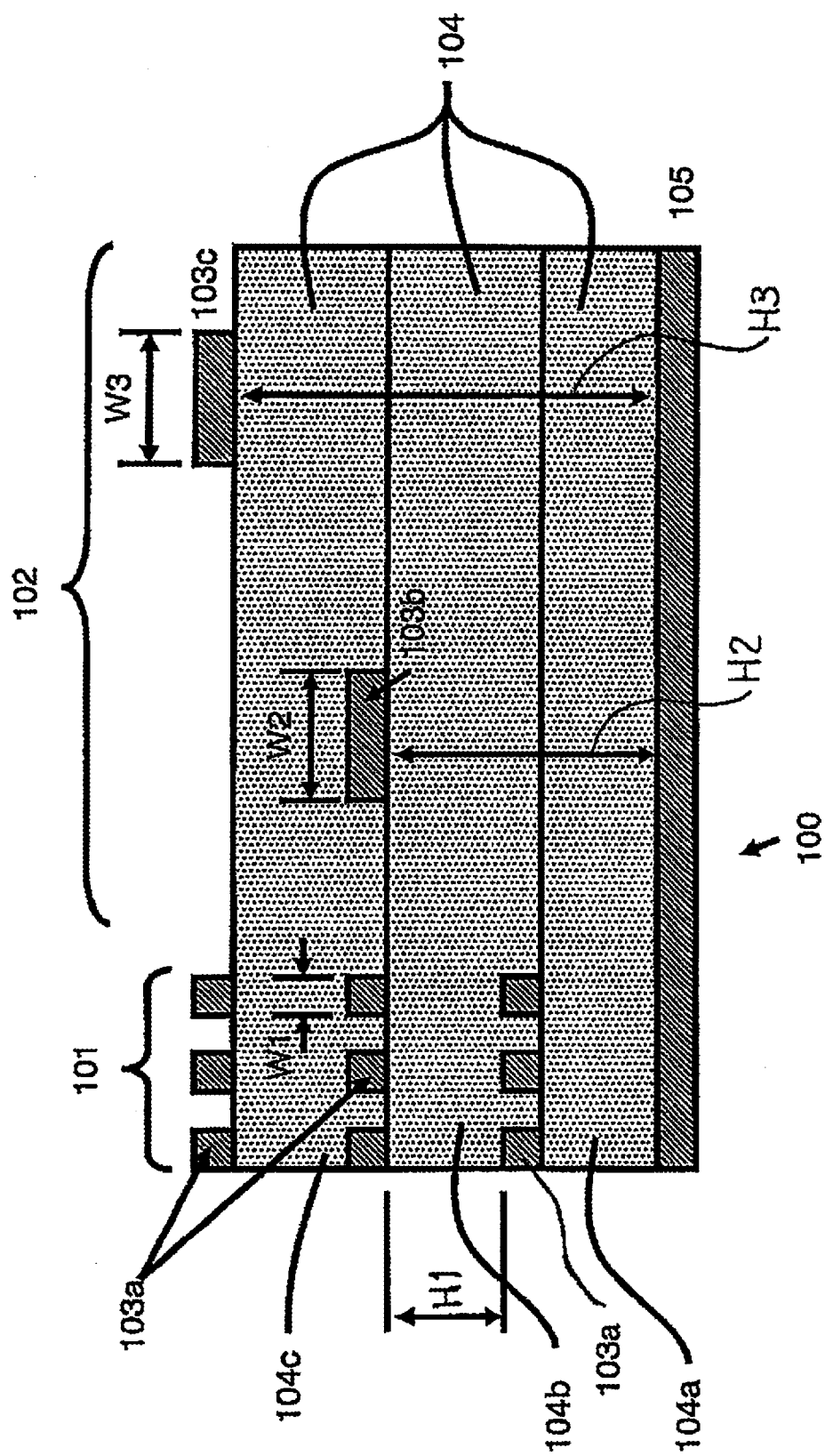
FIG. 3 is a cross-sectional view showing the structure of a multilayer wiring board according to a second embodiment of this invention.

As shown in FIG. 3, in the second embodiment, an insulating layer 104c is formed on the uppermost-layer wirings 103a and 103b described in FIG. 1, wherein, on the insulating layer 104c, wirings 103a are formed in a first wiring region 101 and a wiring 103c is formed in a second wiring region 102 at its second portion other than its first portion where the wiring 103b is formed. At the second portion of the second wiring region 102, the insulating layer below the uppermost-layer wiring 103c is formed with no wiring layer and has an insulating layer thickness H3 which is three times or more the insulating layer thickness H1. The wiring 103c has a width W3 which is preferably greater than the width W2 of the wiring 103b at the first portion. The second embodiment has the same structure as the first embodiment except that the second wiring region (multilayer wiring region) 102 has the insulating layer 104 defined by a plurality of kinds of insulating layer thicknesses H2 and H3 which are twice or more the insulating layer thickness H1 per layer in the first wiring region (multilayer wiring region) 101 and has the wirings 103b and 103c defined by a plurality of kinds of line widths W2 and W3 which are twice or more the line width W1 of the wiring 103a.

Hereinbelow, in respective embodiments, the same symbols are assigned to those components common to the above-mentioned first embodiment, thereby partially omitting description thereof, and hereinbelow, only different points will be described in detail.

In the second embodiment, of the wirings with the plurality of kinds of insulating layer thicknesses in the second wiring region 102, the wiring with the structure having the greater insulating layer thickness below it, i.e. the wiring 103c on the insulating layer having the thickness H3, can more suppress the propagation loss of a high-frequency signal. Although, in FIG. 3, the wirings in the second wring region 102 are represented by the two kinds, i.e. 103b and 103c, the insulating layer thicknesses and the line widths in the wiring structure of the second wiring region 102 are not limited to the two kinds. Further, as long as the relationship to the wiring structure of the first wiring region 101 is satisfied, a combination between the insulating layer thickness and the line width in the wiring structure of the second wiring region 102 is not limited.

(Third Embodiment)

A third embodiment will be described with reference to FIG. 4.

The third embodiment has the same structure as the first embodiment except that, in a boundary region between a first wiring region 101 and a second wiring region 102, a via (VIA) hole, i.e. a hole penetrating an insulating layer in a height direction, is provided and buried with a conductor so that a wiring 106 is formed to be connected to a ground electrode 105 through the conductor. By providing with the via-hole conductor and the wiring 106 which are connected to the ground electrode 105, it is possible to suppress electrical coupling of a signal in a wiring in the first wiring region 101 and a signal in a wiring in the second wiring region 102 and thus to suppress noise to the signal transmitted in the second wiring region 102.

Figure 4:
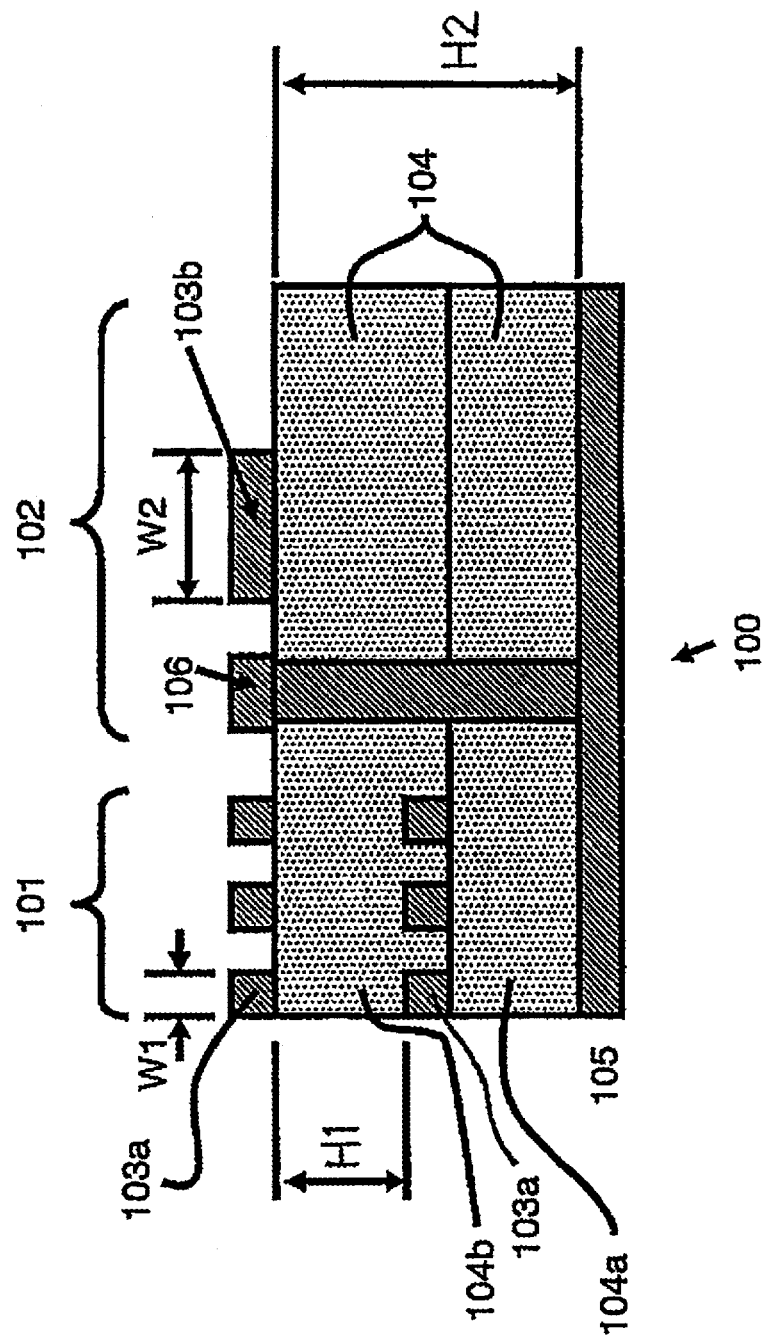
FIG. 4 is a cross-sectional view showing the structure of a multilayer wiring board according to a third embodiment of this invention.

In FIG. 4, the wiring 106 is connected to the conductive film 105 as the ground electrode. However, as long as the wiring 106 is connected to the ground electrode, its positional relationship to the ground electrode is not limited. Further, the cross-sectional structure of the wiring 106 or the cross-sectional structure of the via-hole conductor is not limited to a rectangular shape.

Instead of the structure of connecting the wiring 106 to the ground electrode (conductive film) 105 through the single via-hole conductor as shown in FIG. 4, the wiring 106 may be first connected to a land provided on a surface of a lower insulating layer 104a through a first via-hole conductor penetrating an upper insulating layer 104b and then the land may be connected to the ground electrode 105 through a second via-hole conductor penetrating the lower insulating layer 104a. This example will be described in detail later as Example 2. In this case, the first via-hole conductor and the second via-hole conductor may be arranged in an offset manner, i.e. not aligned in a straight line.

An insulating layer 104c may be formed, like in FIG. 3, on the structure of FIG. 4 and a ground wiring may be provided on the insulating layer 104c between a wiring 103b and a wiring 103c in the second wiring region 102 and connected to the ground electrode 105 through a via-hole conductor.

EXAMPLES

Hereinbelow, this invention will be described based on further detailed Examples, but this invention is not limited thereto.

Example 1

Referring to FIG. 1, as the first wiring region 101 and the second wiring region 102 each having the multilayer wiring structure described in the above-mentioned first embodiment, a microstrip line structure in which the thickness H1 of the insulating layer 104b was 40 μm, the line width W1 of the wiring 103a was 104 μm, and the line thickness T1 of the wiring 103a was 12 μm and a microstrip line structure in which the thickness H2 of the insulating layer 104 was 80 μm, the line width W2 of the wiring 103b was 215 μm, and the line thickness T2 of the wiring 103b was 12 μm were respectively formed in the same board by the methods described in the above-mentioned first embodiment.

In this Example 1, the distance G1 between the wirings in the first wiring region 101 was 100 μm while the distance G2 between the wiring 103a in the first wiring region 101 and the wiring 103b in the second wiring region 102 was 150 μm. As the insulating layer 104, use was made of a polycycloolefin-based insulating material with a relative permittivity of 2.5 at 1 GHz and a dissipation factor of 0.01 at 1 GHz which were derived by a cavity resonance method. As the wirings 103a and 103b and the conductive film 105, metal copper with a resistivity of 1.8 μΩ-cm was deposited by a plating method.

Figure 5:
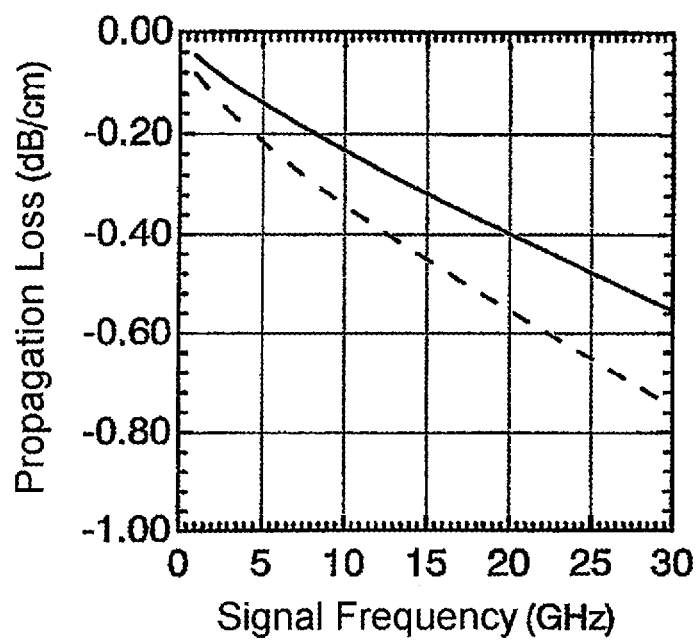
FIG. 5 is a diagram showing relationships between the propagation loss and the signal frequency in a transmission line according to Example 1 of this invention and in a transmission line with a microstrip line structure formed in a second wiring region of a multilayer wiring board as a Comparative Example.

Results of measuring the propagation loss at signal frequencies in the second wiring region 102 of the multilayer wiring board 100 by an S-parameter method are shown by a solid line in FIG. 5.

Assuming that the occupied cross-sectional area per wiring in the first wiring region 101 is 1, the occupied cross-sectional area of the wirings in the multilayer wiring board 100 in Example 1 was 10.1.

Comparative Example 1

A multilayer wiring board 100 was manufactured in the same manner as in the above-mentioned Example 1 except that a second wiring region 102 had a microstrip line structure being the same as that of a first wiring region 101, wherein a thickness H2 of an insulating layer 104 was 40 μm and a line width W2 of a wiring 103b was 104 μm. Results of measuring the propagation loss at signal frequencies in this second wiring region 102 by the S-parameter method are shown by a dashed line in FIG. 5.

Assuming that the occupied cross-sectional area per wiring in the first wiring region 101 is 1, the occupied cross-sectional area of the wirings in the multilayer wiring board 100 in Comparative Example 1 was 7.0.

Comparative Example 2

A multilayer wiring board 100 was manufactured in the same manner as in the above-mentioned Example 1 except that a first wiring region 101 had a microstrip line structure being the same as that of a second wiring region 102, wherein the insulating layer thickness was 80 μm and the line width was 215 μm.

The propagation loss at signal frequencies in the second wiring region 102 of this multilayer wiring board 100 took values equal to those of the propagation loss at signal frequencies in the second wiring region 102 in Example 1.

Assuming that the occupied cross-sectional area per wiring in the first wiring region 101 is 1, the occupied cross-sectional area of the wirings in the multilayer wiring board 100 in Comparative Example 2 was 29.9.

As shown in FIG. 5, it was confirmed that the propagation loss of a high-frequency signal was made smaller in Example 1 than in Comparative Example 1. Further, it was confirmed that it was possible to make the occupied cross-sectional area of the wirings smaller in Example 1 than in Comparative Example 2.

Figure 6:
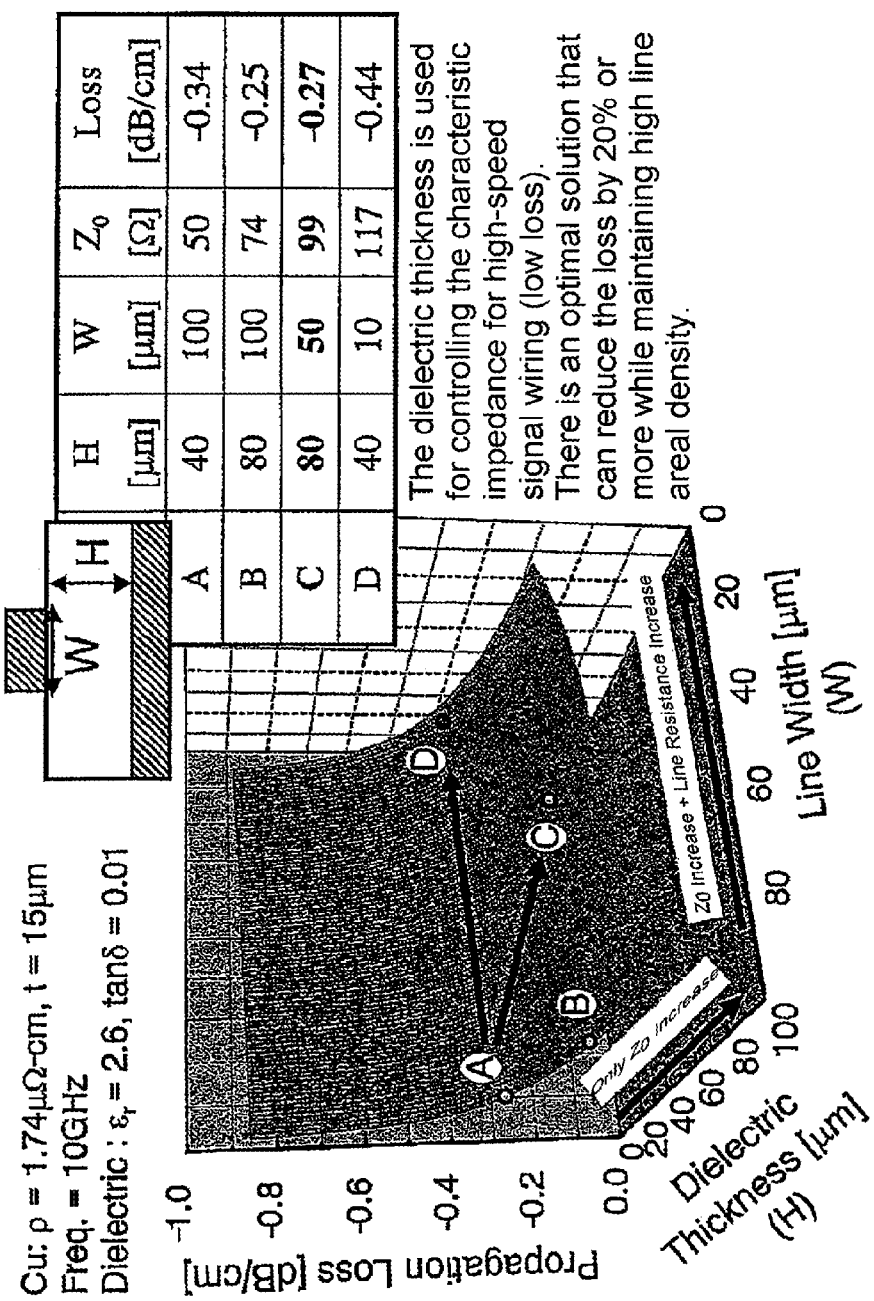
FIG. 6 is a characteristic diagram which derives relationships between the line width, the dielectric thickness (insulating layer thickness), and the propagation loss in the case of a dielectric with a relative permittivity of 2.6 and a dissipation factor of 0.01 at 10 GHz.

FIG. 6 is a characteristic diagram which derives relationships between the line width W, the dielectric thickness (insulating layer thickness) H, and the propagation loss in the case of a dielectric with a relative permittivity $\epsilon_r=2.6$ and a dissipation factor tan $\delta=0.01$ at 10 GHz.

Figure 7:
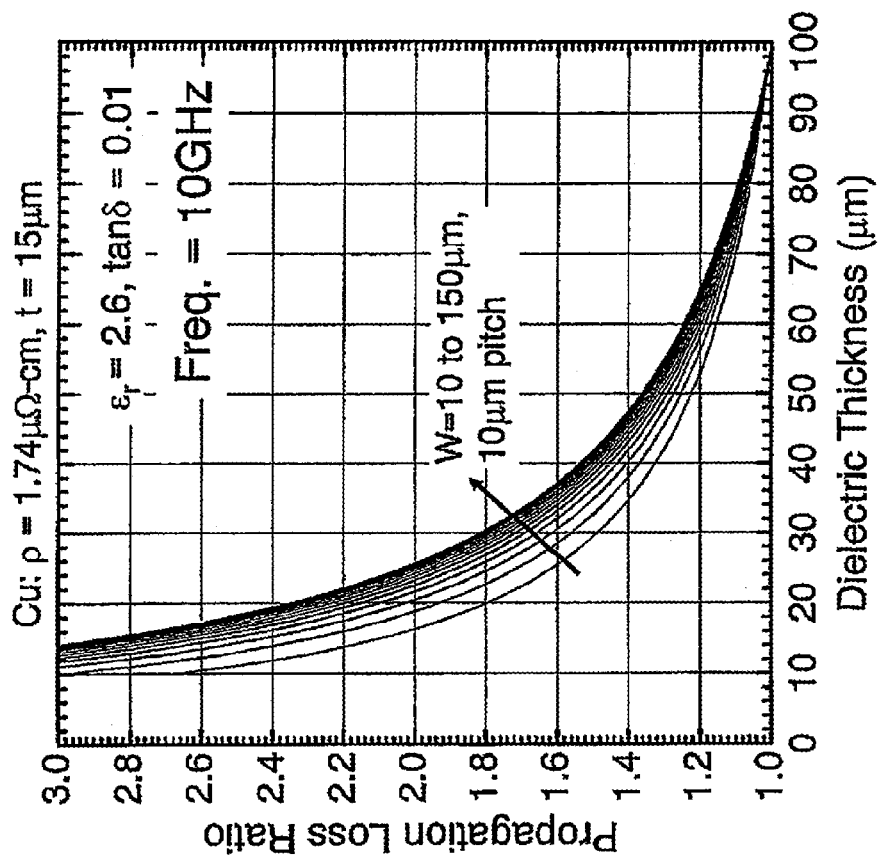
FIG. 7 is a characteristic diagram which derives relationships between the dielectric thickness (insulating layer thickness) and the propagation loss in the case of a dielectric with a relative permittivity of 2.6 and a dissipation factor of 0.01 at 10 GHz.

FIG. 7 is a characteristic diagram which derives relationships between the dielectric thickness (insulating layer thickness) and the propagation loss in the case of a dielectric with a relative permittivity $\epsilon_r=2.6$ and a dissipation factor tan $\delta=0.01$ at 10 GHz. As shown in FIG. 7, when the thickness of the insulating layer is set to 40 μm or more, the propagation loss is extremely reduced.

Figure 8:
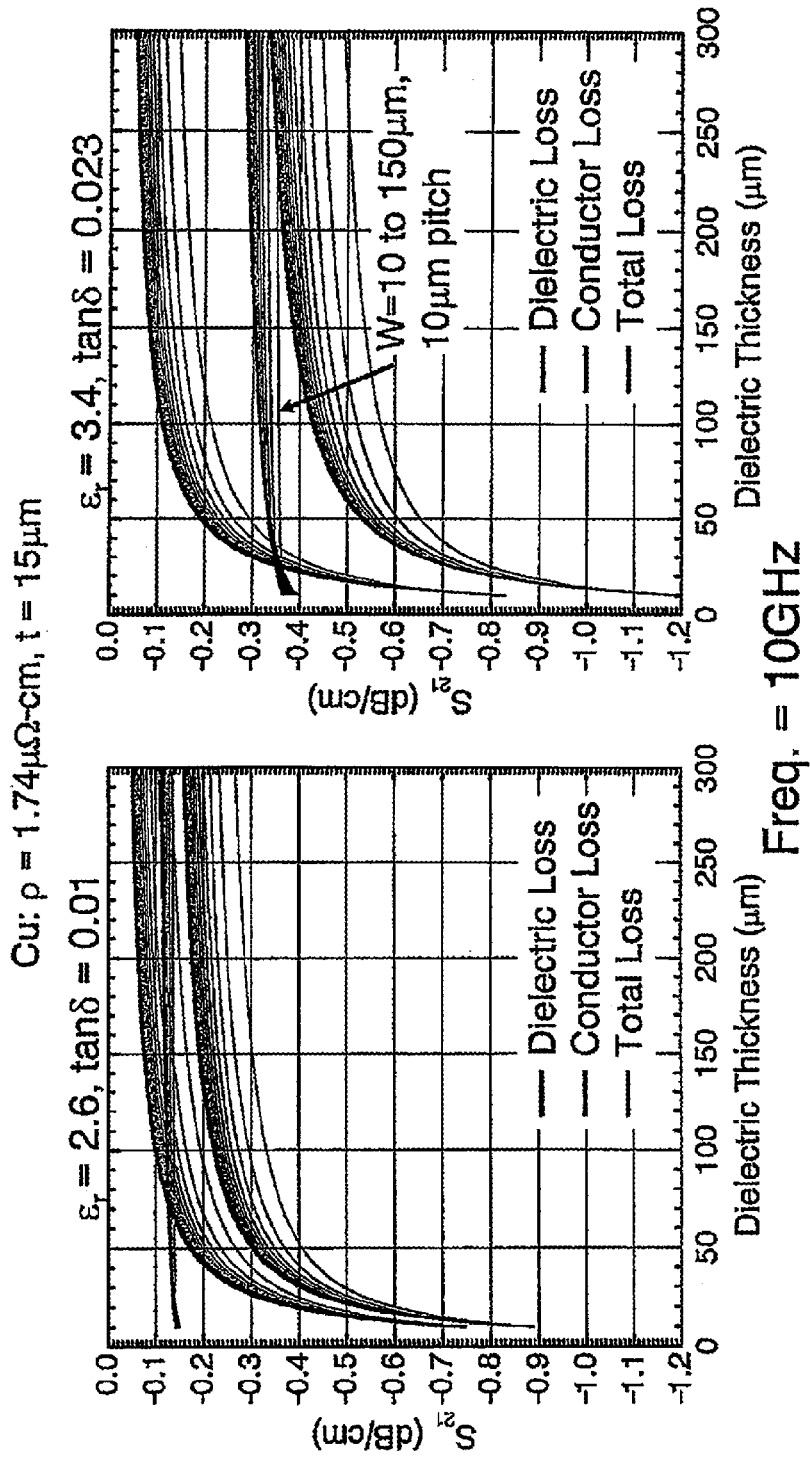
FIG. 8 is a characteristic diagram showing relationships between the dielectric thickness (insulating layer thickness) and the propagation loss for comparison in the case of different relative permittivities and dissipation factors.

On the other hand, FIG. 8 is a diagram showing relationships between the dielectric thickness (insulating layer thickness) and the propagation loss in transmission of a 10 GHz signal for comparison between a dielectric with a relative permittivity $\epsilon_r=2.6$ and a dissipation factor tan $\delta=0.01$ at 10 GHz (on the left in the figure) and a dielectric with a relative permittivity $\epsilon_r=3.4$ and a dissipation factor tan $\delta=0.023$ at 10 GHz (on the right in the figure).

Figure 9:
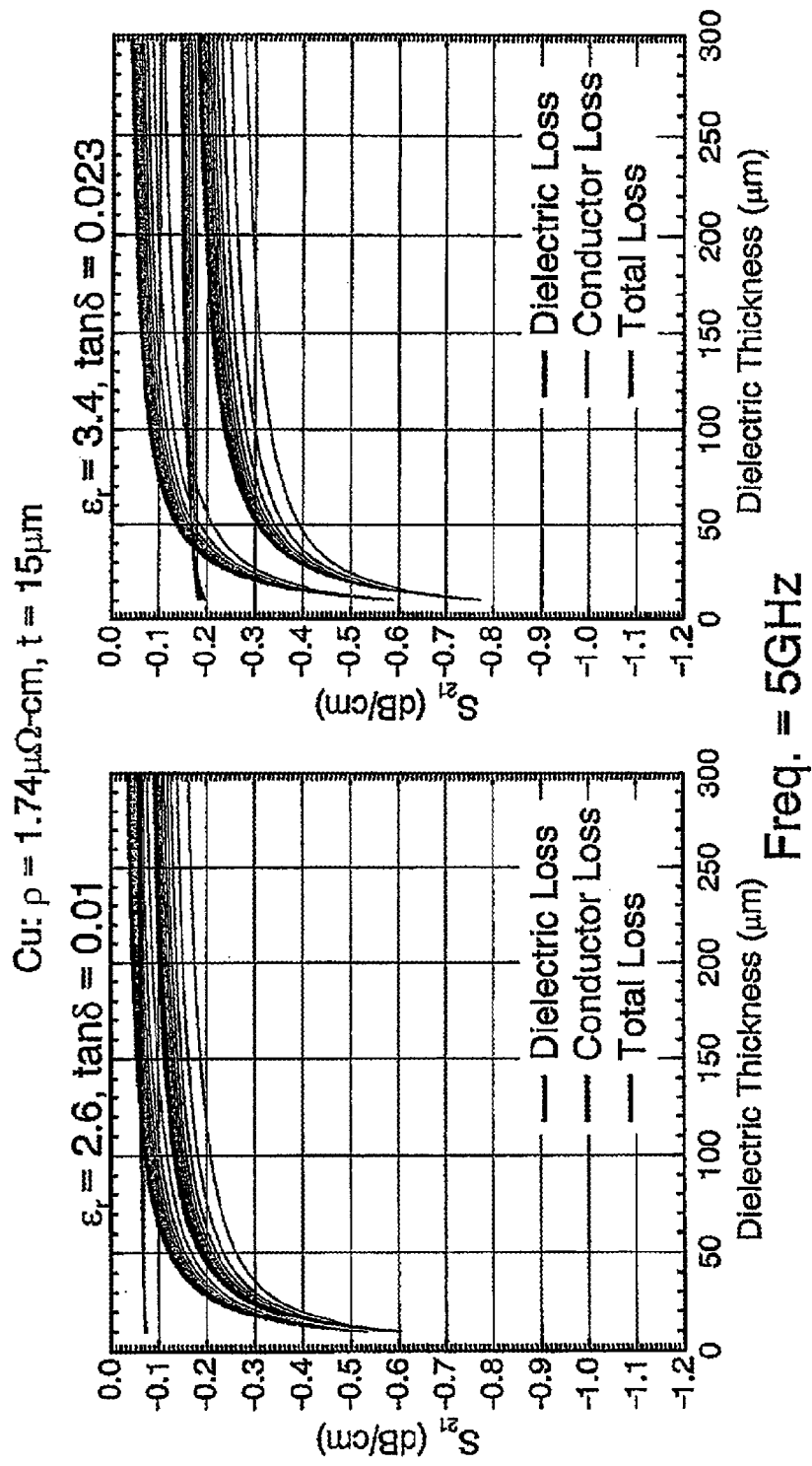
FIG. 9 is a characteristic diagram showing relationships between the dielectric thickness (insulating layer thickness) and the propagation loss obtained under the same conditions as in FIG. 8 except the condition of frequency.

FIG. 9 shows relationships between the dielectric thickness (insulating layer thickness) and the propagation loss obtained under the same conditions as in FIG. 8 except a frequency of 5 GHz. It is seen that, as shown on the left in FIG. 9, in the case of the insulating layer with a relative permittivity $\epsilon_r=2.6$ and a dissipation factor tan $\delta=0.01$, the propagation loss can be extremely reduced as compared with the right in FIG. 9.

From FIGS. 6 to 9, it can be confirmed that the propagation loss of a high-frequency signal can be reduced like in Example 1 and particularly that the propagation loss reduction effect by increasing the dielectric thickness, i.e. the insulating layer thickness, and reducing the relative permittivity and the dissipation factor of the insulating layer is significant. The propagation loss reduction effect is significant when the relative permittivity is 2.7 or less and the dissipation factor is 0.015 or less.

Example 2

Figure 10:
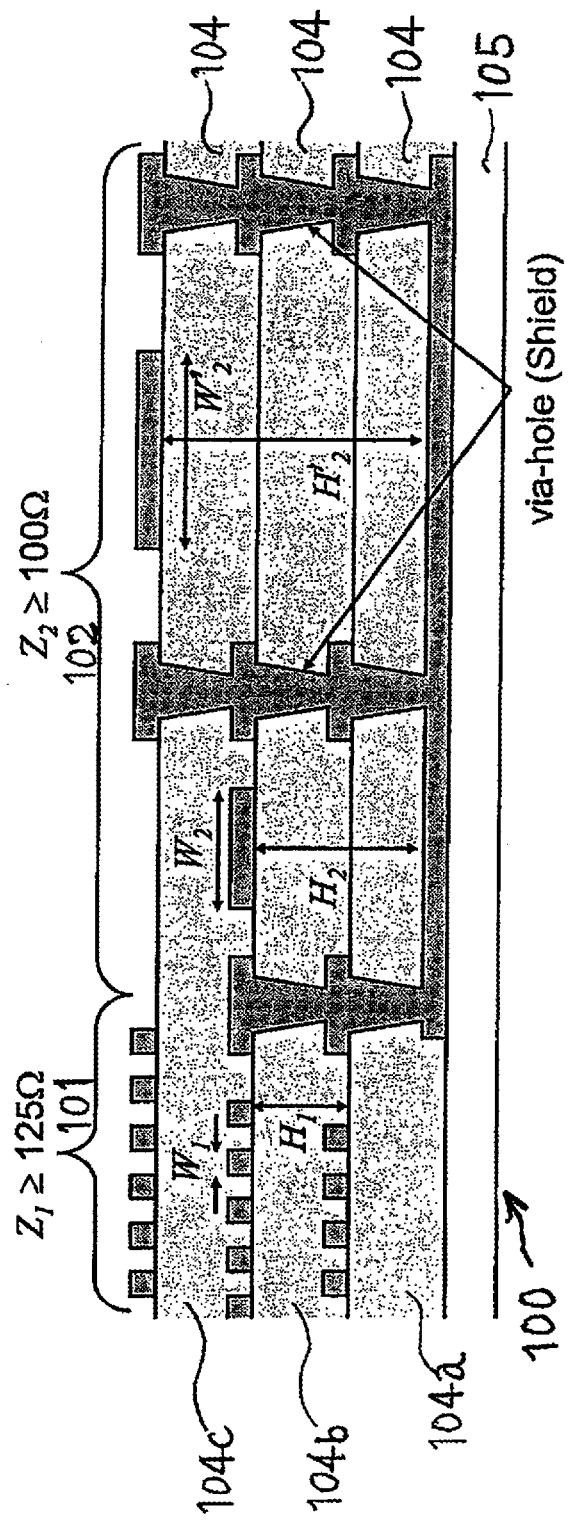
FIG. 10 is a cross-sectional view showing the structure of a multilayer wiring board according to Example 2 of this invention.

Referring to FIG. 10, a description will be given of a multilayer wiring board 100 which is an Example combining the second and third embodiments described with reference to FIGS. 3 and 4. This multilayer wiring board 100 can be called a high-impedance printed wiring board with a plurality of dielectric thicknesses mixed and its structure has, in the single printed wiring board 100, a region that can transmit an ultrahigh-frequency signal in a GHz band, particularly of 10 GHz or more, with a low consumption power, while suppressing a reduction in mounting density to minimum.

Features of this high-impedance printed wiring board with the plurality of dielectric thicknesses mixed are summarized as follows.

A) The single printed wiring board 100 has a high-density mounting region 101 for transmitting a low-frequency DC power supply of 1 GHz or less and a high-frequency transmission region 102 that can achieve high-frequency transmission exceeding 1 GHz with a low loss.

B) In the high-density mounting region 101, the line width W is formed as small as possible, thereby improving the mounting density. In order to suppress the line loss, an extreme reduction in dielectric thickness H is not performed. In order also to keep a line characteristic impedance Z1 of the high-density mounting region 101 equal to or higher than 125Ω to thereby achieve a low consumption power, it is necessary to suppress the reduction in thickness of the dielectric film. For example, when a polycycloolefin resin film with a relative permittivity $\epsilon_r=2.60$ is used and the dielectric film thickness and the line height are set to H1=40 μm and T=10 μm, respectively, the line width for providing the characteristic impedance Z1=125Ω is W1=9.4 μm. This wiring can be achieved by a smooth plating printed wiring technique.

C) The high-frequency transmission region 102 has a first portion and a second portion. In order to suppress the line metal loss, the dielectric film thickness is set to be twice (H2=2×H1) or more the dielectric film thickness of the high-density mounting region 101 at the first portion and to be three times (H2'=3×H1) or more at the second portion. These dielectric film thicknesses can be achieved by applying a build-up multilayer printed wiring board forming method. That is, a plated copper wiring on a lower-layer dielectric resin film in the high-frequency transmission region 102 is removed by etching during wiring patterning and then second-layer and third-layer resin films are built up thereon, thereby achieving the dielectric film thicknesses without newly introducing any special process. A characteristic impedance Z2 of the high-frequency transmission region 102 is set to 100Ω or more. This is for reducing the consumption power and suppressing an increase in line width following the increase in dielectric resin film thickness to thereby improve the mounting density. For example, when a dielectric resin film with a relative permittivity $\epsilon_r$=2.60 is used and the dielectric film thickness and the line height are set to H2=80 μm and T=10 μm, respectively, the line width for providing the characteristic impedance Z2=50Ω is W2=209 μm. On the other hand, when the wiring is designed to provide the characteristic impedance Z2=100Ω, the line width becomes W2=52 μm so that the increase in line width can be suppressed while achieving ½ consumption power. A width W2' of a wiring at the second portion is set greater than (preferably twice or more) the width W2 of the wiring at the first portion.

D) In the boundary between the high-frequency transmission region 102 and the high-density mounting region 101, a noise shield in the form of a via-hole is provided for reducing electrical signal coupling between the wirings to suppress crosstalk noise that is superimposed on transmission signals. Also in the high-frequency transmission region 102, a noise seal in the form of a via-hole conductor is provided for reducing electrical signal coupling between the wirings at the first portion and the second portion. Instead of the above-mentioned structure of connecting to the ground electrode (conductive film) 105 through the single via-hole conductor as shown in FIG. 4, this Example employs the following structure. First, a land provided on a surface of a lower insulating layer 104*a* is connected to a ground electrode (conductive film) 105 through a via-hole conductor penetrating the lower insulating layer 104*a*, then the land provided on the surface of the lower insulating layer 104*a* is connected to a land provided on a surface of an upper insulating layer 104*b* through a via-hole conductor penetrating the upper insulating layer 104*b*, and further the land provided on the surface of the upper insulating layer 104*b* is connected to a land provided on a surface of an insulating layer 104*c* through a via-hole conductor.

In order to demonstrate the effect of the high-impedance printed wiring board with the plurality of dielectric thicknesses mixed according to Example 2, the following test was performed.

First, a high-impedance printed wiring board with a plurality of dielectric thicknesses mixed was manufactured according to the manufacturing flow of a build-up multilayer printed wiring board shown in FIG. 11. Using a polycycloolefin resin with a thickness H=40 μm as a dielectric resin film, a wiring region (characteristic impedance Z1=123Ω) with a dielectric thickness H1=40 μm, a line width W1=10 μm, and a line height T=10 μm and a wiring region (characteristic impedance Z2=101Ω) having a microstrip line with H2=80 μm, W2=50 μm, and T=10 μm were formed on the same board as a high-density mounting region 101 and a high-frequency transmission region 102, respectively, thereby demonstrating the high-impedance printed wiring board with the plurality of dielectric thicknesses mixed.

In the high-frequency transmission region 102, a first-layer copper plating wiring is removed during etching, thereby obtaining a thickness of 2×H=H2=80 μm including a second-layer dielectric resin film. This process flow can be achieved in a wiring forming process of a build-up multilayer printed wiring board using a technique of forming smooth plating on a polycycloolefin resin.

Then, in order to confirm the propagation characteristics of the high-frequency transmission region 102, microstrip line structures were formed by the same process as shown in FIG. 11, thereby judging the high-frequency propagation characteristics thereof. The dielectric film thickness was set to H2=80 μm or H2'=120 μm by laminating two or three polycycloolefin resin layers each having H=40 μm. There were manufactured two kinds of microstrip line structures, i.e. with line characteristic impedances Z0=50Ω and Z0=100Ω. The wiring dimensions of the manufactured microstrip line structures are shown in FIG. 12.

By comparing measured values of the propagation characteristics of the above-mentioned microstrip lines and the propagation characteristics of microstrip lines of H=40 μm, an influence of difference in dielectric film thickness given to the propagation characteristics was measured, thereby demonstrating the superiority of the high-impedance printed wiring board with the plurality of dielectric thicknesses mixed. Further, the propagation characteristics of the high-impedance printed wiring board with the plurality of dielectric thicknesses mixed were analyzed using high-frequency RLGC models and its superiority was confirmed.

Figure 13:
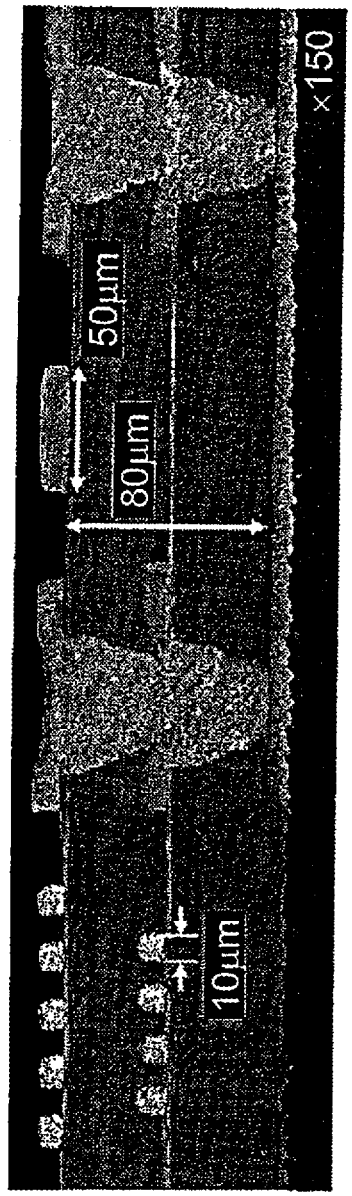
FIG. 13 is a photograph showing a cross-sectional image, observed by an optical microscope, of a multilayer wiring board manufactured as Example 2.

FIG. 13 shows a cross-sectional image, observed by an optical microscope, of a high-impedance printed wiring board with a plurality of dielectric thicknesses mixed which was manufactured using a smooth plated dielectric resin film with low permittivity and low dielectric loss. As a high-density mounting region on the left in the figure, wirings with a width W1=10 μm are formed per dielectric film layer of H1=40 μm, while, as a high-frequency transmission region on the left in the figure, a wiring with a line width W2=50 μm is precisely formed on a film thickness H2=80 μm corresponding to two dielectric film layers. This shows that the high-impedance printed wiring board with the plurality of dielectric thicknesses mixed can be formed by the build-up multilayer printed wiring board process.

Figure 14:
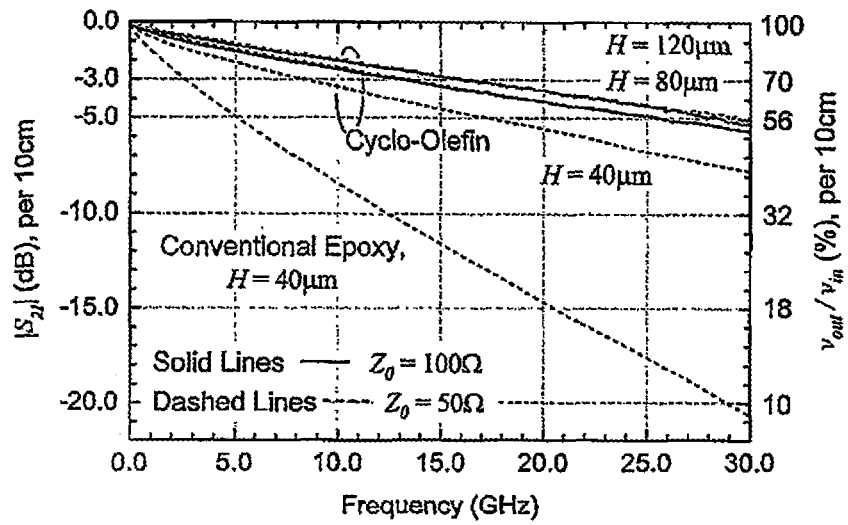
FIG. 14 is a diagram showing the propagation characteristics of the microstrip lines manufactured in Example 2.

FIG. 14 shows the high-frequency propagation characteristics of the manufactured microstrip lines. By reducing the propagation loss using a smooth plated dielectric resin film with low permittivity and low dielectric loss and further by setting the dielectric film thickness to H2=80 μm or H2'=120 μm, ultrahigh-frequency transmission exceeding 10 GHz is achieved with a propagation loss of −3 dB/10 cm. It was demonstrated that even if a wiring was miniaturized with a characteristic impedance being set to Z0=100Ω, the propagation loss was suppressed to be approximately equal to that of the microstrip line with Z0=50Ω. This is because since the line metal loss is approximately equal to "line resistance/ (characteristic impedance)×2", even if the line resistance increases by the miniaturization of the wiring, an increase in line loss can be prevented by increasing the characteristic impedance. In this manner, since the wiring can be miniaturized by increasing the characteristic impedance, while suppressing a reduction in in-plane mounting density also in the high-frequency signal transmission region, it is possible to propagate a transmission signal exceeding 10 GHz for 10 cm or more and further to suppress the consumption power per wiring to ½ or less as compared with conventional.

Figure 15:
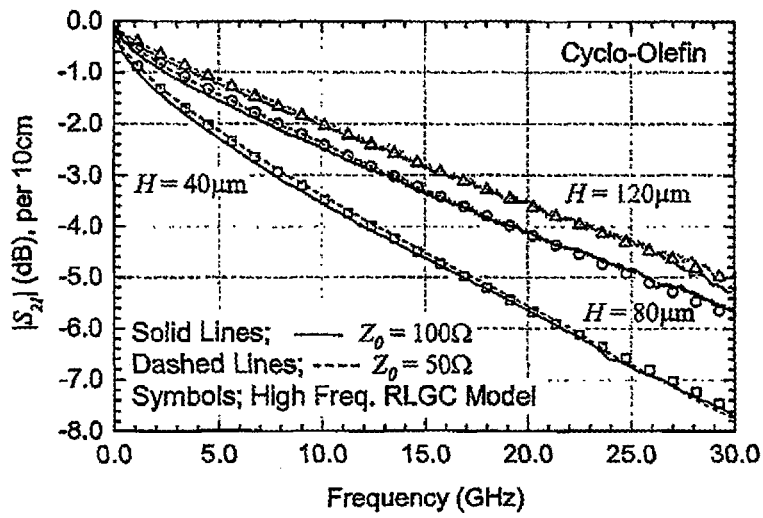
FIG. 15 is a diagram showing the propagation characteristics of the microstrip lines manufactured in Example 2 and the calculation results of high-frequency RLGC models.

FIG. 15 shows the same measurement results of the propagation characteristics as those in FIG. 14 and the calculation results of the propagation characteristics obtained by the high-frequency RLGC models. As the dielectric properties of a polycycloolefin resin and the wiring dimensions for the models, the values of FIG. 12 were used. The line resistivity is given by ρ=1.72 μΩ-cm and an increase in line loss due to surface roughness is not taken into account. The measurement results and the calculation results of the high-frequency RLGC models well agree with each other for the respective film thicknesses and thus it is seen that the roughness of the dielectric-metal interface or the resin film interface due to the lamination of the dielectric resin films does not affect the propagation characteristics.

Figure 16:
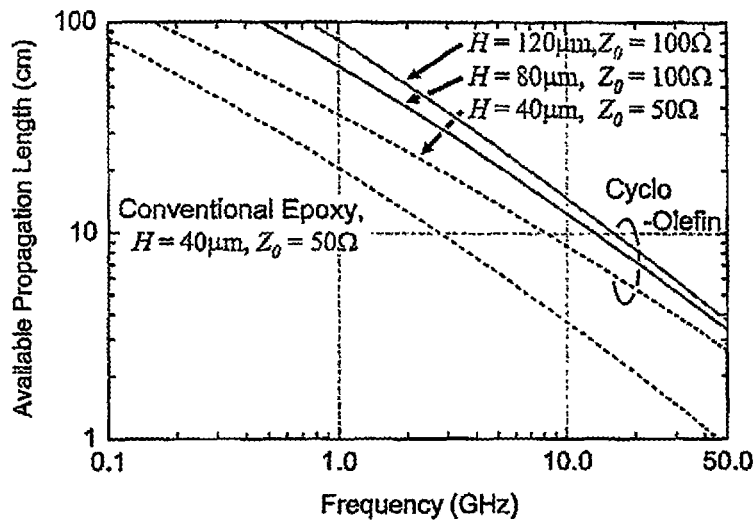
FIG. 16 is a diagram showing the available propagation length characteristics of the microstrip lines manufactured in Example 2.

FIG. 16 shows the available propagation length calculated from the propagation characteristics of the manufactured microstrip lines. The available propagation length is defined as a signal propagation length where /S21/ becomes −3 dB or less. In comparison for a propagation length of 10 cm which is generally required on a printed wiring board, it was demonstrated that propagation of an ultrahigh frequency such as fp=13.0 GHz with H2=80 μm and Z0=100Ω or fp=16.1 GHz with H2'=120 μm and Z0=100Ω was enabled.

Figure 17:
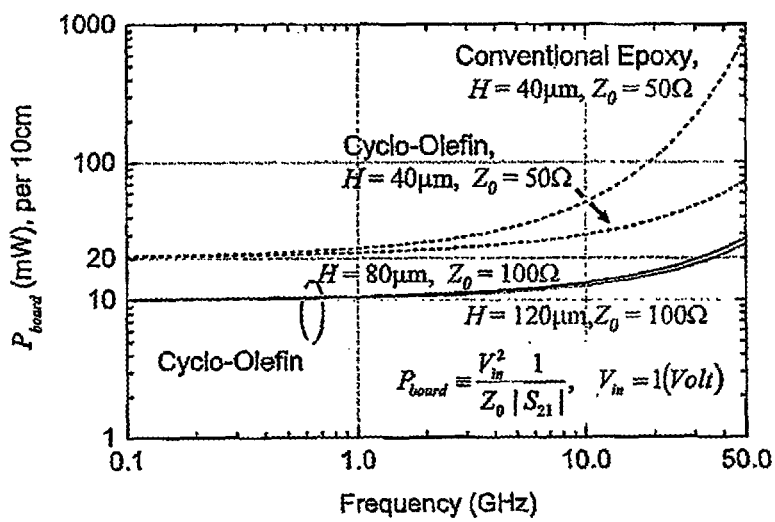
FIG. 17 is a diagram showing the consumption power characteristics of the microstrip lines manufactured in Example 2.

FIG. 17 shows the consumption power in propagation for 10 cm per wiring calculated from the propagation characteristics described above. By increasing the characteristic impedance Z0 to 100Ω and reducing the propagation loss, the consumption power per wiring when a 10 GHz signal is transmitted for 10 cm was $P_{board}$=13.3 mW in the case of H2=80 μm and Z0=100Ω or $P_{board}$=12.6 mW in the case of H2'=120 μm and Z0=100Ω. Therefore, as compared with a consumption power of 51.3 mW of a conventional microstrip line with H=40 μm and Z0=50Ω formed on an epoxy resin, the consumption power was suppressed to about ¼ and thus a large reduction in consumption power was achieved. It was confirmed that, also in the low-frequency region, it was possible to reduce the consumption power to ½ because the characteristic impedance was doubled.

FIG. 18 shows the propagation characteristics of the manufactured microstrip lines in terms of the frequency fp that enables propagation with a loss suppressed to −3 dB for a length of 10 cm, and the consumption power $P_{board}$ per wiring while comparing with the conventional example. Using the wiring structure with the plurality of dielectric thicknesses mixed which uses, as the dielectric resin film, the low-permittivity, low-dielectric-loss polycycloolefin resin by employing the smooth plating technique, it is possible to realize an ultrahigh-frequency, low-consumption-power, high-density printed wiring board that can achieve transmission of a signal of 10 GHz or more with a low consumption power of ½ or less as compared with conventional, while maintaining the mounting density.

The polycycloolefin-based insulating material was used as the insulating layer 104 in the above-mentioned Examples, but not limited thereto as long as it is the above-mentioned insulator with a resistivity of 1 kΩ-cm or more as measured according to JISC3005. For example, epoxy resin, phenol resin, polyimide resin, polyester resin, fluororesin, modified polyphenyl ether resin, bismaleimide-triazine resin, modified polyphenylene oxide resin, silicone resin, acrylic resin, benzocyclobutene resin, polyethylene naphthalate resin, polycycloolefin resin, polyolefin resin, cyanate ester resin, melamine resin, and so on are cited as examples. Metal copper was used as the material of the wirings 103a and 103b and the conductive film 105 in the Examples, but not limited thereto as long as it is the above-mentioned material with a resistivity of less than 1 kΩ-cm as measured according to JISC3005. For example, copper, gold, silver, aluminum, nickel, conductive carbon, and so on are cited as examples. Further, a method of forming the wirings 103a and 103b and the conductive film 105 is not limited to the plating method and use may alternatively be made of, for example, a sputtering method, an organic metal CVD method, a method of bonding a film of metal such as copper, or the like.

This invention is not limited to the above-mentioned embodiments and can be modified in various manners within the scope of this invention. For example, the wiring structures according to this invention can also be applied to wiring structures other than the microstrip wiring structures, for example, to strip wiring structures or other multilayer wiring structures.

Hereinbelow, a description will be given of achievable aspects of this invention.

(Aspect 1)

A semiconductor device characterized by using the multilayer wiring board according to any of the above-mentioned embodiments as a board for mounting a semiconductor element.

(Aspect 2)

A semiconductor device of Aspect 1, characterized in that the semiconductor element and the multilayer wiring board are accommodated in the same package.

(Aspect 3)

A semiconductor device of Aspect 1 or 2, characterized in that a signal having a frequency of 1 GHz or less is transmitted in the first wiring region and a signal having a frequency exceeding 1 GHz is transmitted in the second wiring region.

(Aspect 4)

A semiconductor device of any of Aspects 1 to 3, characterized in that the second wiring region includes a portion where a signal is transmitted for 1 cm or more.

(Aspect 5)

An electronic device characterized by using the multilayer wiring board according to any of the above-mentioned embodiments as a board for mounting a plurality of electronic components.

(Aspect 6)

An electronic device of Aspect 5, characterized in that the plurality of electronic components and the multilayer wiring board are accommodated in the same case.

(Aspect 7)

An electronic device of Aspect 5 or 6, characterized in that a signal having a frequency of 1 GHz or less is transmitted in the first wiring region and a signal having a frequency exceeding 1 GHz is transmitted in the second wiring region.

(Aspect 8)

An electronic device of any of Aspects 5 to 7, characterized in that the second wiring region includes a portion where a signal is transmitted for 1 cm or more.

Description of Symbols 100 multilayer wiring board
101 first wiring region (high-density mounting region)
102 second wiring region (high-frequency transmission region)
103a wiring in the first wiring region
103b, 103c wirings in the second wiring region
104, 104a, 104b insulating layers
105 conductive film (ground electrode)

The invention claimed is:

1. A multilayer wiring board comprising a first wiring region where a plurality of first wiring layers are laminated through a first insulating layer, and a second wiring region including a second insulating layer with a thickness which is twice or more a thickness of the first insulating layer and including a second wiring layer provided on the second insulating layer, the second wiring layer having a width which is twice or more a width of the first wiring layer, wherein the first wiring region and the second wiring region are integrally formed on the same board.

2. The multilayer wiring board according to claim 1, wherein the second wiring region further includes a portion comprising a third insulating layer with a thickness greater than the thickness of the second insulating layer and comprising a third wiring layer provided on the third insulating layer, the third wiring layer having a width greater than the width of the second wiring layer.

3. The multilayer wiring board according to claim 1, wherein the width of the wiring layer in the second wiring region is 30μm or more and the thickness of the insulating layer in the second wiring region is 40μm or more.

4. The multilayer wiring board according to claim 1, wherein a conductor is formed to penetrate an insulating layer at a boundary portion between the first wiring region and the second wiring region and is grounded.

5. The multilayer wiring board according to claim 1, wherein a characteristic impedance of a wiring pattern formed by the wiring layer in the second wiring region is 100Ω or more.

6. The multilayer wiring board according to claim 1, wherein the insulating layer in the second wiring region has a relative permittivity of 2.7 or less and a dissipation factor of 0.015 or less.

7. A semiconductor device characterized by using the multilayer wiring board according to claim 1 as a board for mounting a semiconductor element.

8. The semiconductor device according to claim 7, wherein the semiconductor element and the multilayer wiring board are accommodated in the same package.

9. The semiconductor device according to claim 7, wherein a signal having a frequency of 1GHz or less is transmitted in the first wiring region and a signal having a frequency exceeding 1GHz is transmitted in the second wiring region.

10. The semiconductor device according to claim 7, wherein the second wiring region includes a portion where a signal exceeding 1GHz is transmitted for 1cm or more.

11. An electronic device characterized by using the multilayer wiring board according to claim 1 as a board for mounting a plurality of electronic components.

12. The electronic device according to claim 11, wherein the plurality of electronic components and the multilayer wiring board are accommodated in the same case.

13. The electronic device according to claim 11, wherein a signal having a frequency of 1GHz or less is transmitted in the first wiring region and a signal having a frequency exceeding 1GHz is transmitted in the second wiring region.

14. The electronic device according to claim 1, wherein the second wiring region includes a portion where a signal exceeding 1GHz is transmitted for 1cm or more.

* * * * *